(12) United States Patent
Yoon et al.

(10) Patent No.: US 8,446,090 B2
(45) Date of Patent: May 21, 2013

(54) ORGANIC LIGHT-EMITTING DEVICE

(75) Inventors: Seok-Gyu Yoon, Yongin (KR);
Kyu-Hwan Hwang, Yongin (KR);
Jae-Heung Ha, Yongin (KR);
Young-Woo Song, Yongin (KR);
Jong-Hyuk Lee, Yongin (KR);
Sung-Chul Kim, Yongin (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 13/237,808

(22) Filed: Sep. 20, 2011

(65) Prior Publication Data

US 2012/0112628 A1    May 10, 2012

(30) Foreign Application Priority Data

Nov. 9, 2010    (KR) .......................... 10-2010-0110998

(51) Int. Cl.
*H01L 51/00*    (2006.01)

(52) U.S. Cl.
USPC .......................................... 313/504; 313/512

(58) Field of Classification Search
USPC ................... 313/498–512; 428/690
See application file for complete search history.

(56) References Cited

U.S. PATENT DOCUMENTS

| 7,629,741 B2 | 12/2009 | Liao et al. |
| 2007/0176169 A1 | 8/2007 | Lee et al. |
| 2008/0024059 A1* | 1/2008 | Hsu ............................ 313/506 |
| 2010/0301741 A1 | 12/2010 | Kim et al. |

FOREIGN PATENT DOCUMENTS

| KR | 1020040103059 A | 12/2004 |
| KR | 1020070043293 A | 4/2007 |
| KR | 10-2007-0078599 A | 8/2007 |
| KR | 10-2010-0129596 A | 12/2010 |
| WO | WO 2006/132226 A1 | 12/2006 |

OTHER PUBLICATIONS

W.F. Xie, K.C. Lau, C.S. Lee, S.T. Lee, Transparent organic light-emitting devices with LiF/Yb:Ag cathode, Journal, 2007, 6975-6977, 515, Thin Solid Films.

Xie WF, Lau KC, Lee CS, Lee ST, Transparent organic light-emitting devices with LiF/Yb : Ag cathode, Journal, 2007, vol. 515, Thin Solid Films, vol. 515, No. 17, Chemical Engineering Research Information Center.

* cited by examiner

*Primary Examiner* — Anne Hines
(74) *Attorney, Agent, or Firm* — Knobbe Martens Olson & Bear LLP (57) ABSTRACT

An organic light-emitting device including an anode, a cathode having a double-layered structure, and an emission layer between the anode and the cathode.

18 Claims, 3 Drawing Sheets

ORGANIC LIGHT-EMITTING DEVICE

CROSS-REFERENCE TO RELATED APPLICATION

This application claims the benefit of Korean Patent Application No. 10-2010-0110998, filed on Nov. 9, 2010, in the Korean Intellectual Property Office, the entire contents of which are incorporated herein by reference.

BACKGROUND

1. Field

The present embodiments relate to an organic light-emitting device including an anode, a cathode having a double-layered structure, and an emission layer between the anode and the cathode.

2. Description of the Related Technology

With the advent of the $21^{st}$ century, the trend toward an information-oriented society has been accelerating, and along with a necessity for receiving and transmitting information anytime anywhere, conventional cathode-ray tube (CRT) displays are being replaced with flat panel displays. One of the most common types of flat panel displays currently being used are liquid crystal displays (LCDs). This is because LCDs are lightweight and have low power consumption. However, since an LCD is a passive light-emitting device and not a self-light emitting device, the LCD has technical limitations in terms of a contrast ratio, a viewing angle, and area size. Accordingly, new flat panel displays that can overcome such technical limitations are being developed worldwide. One type of such new flat panel display uses organic light emitting diodes (OLEDs). OLEDs can be driven at low power, have a wide viewing angle and quick response speed, and are self-light emitting, light weight, and thin. Accordingly, research and development have been accelerated in Japan, Korea, and the US regarding practical uses of OLEDs.

A cathode of an active matrix organic light emitting device (AMOLED) currently used in mobile displays is formed by deposition of a combination of magnesium (Mg) and silver (Ag). However, the cathode may have an area specific resistance (ASR) as high as ~50 Ω/sq. at a thickness of 120 Å, and thus be not applicable in 4-inch or larger mobile devices due to an IR drop problem.

SUMMARY OF CERTAIN INVENTIVE ASPECTS

The present embodiments provide an organic light-emitting device having a structure that provides improved active matrix organic light-emitting device (AMOLED) efficiency and more reliable high-temperature characteristics as compared to a structure of an organic light-emitting device using a magnesium (Mg)-silver (Ag) cathode.

According to an aspect of the present embodiments, there is provided an organic light-emitting device including: an anode; a cathode; and an emission layer between the anode and the cathode, wherein the cathode includes: a first layer in which are co-deposited LiF or Liq and a metal selected from the group consisting of ytterbium (Yb), calcium (Ca), samarium (Sm), europium (Eu), terbium (Tb), strontium (Sr), barium (Ba), lanthanum (La), and cerium (Ce); and a second layer in which are co-deposited silver (Ag) or aluminum (Al), and a metal selected from the group consisting of Yb, Ca, Sm, Eu, Tb, Sr, Ba, La, and Ce.

A composition ratio of the LiF or Liq to the metal selected from the group consisting of Yb, Ca, Sm, Eu, Tb, Sr, Ba, La, and Ce in the first layer may be from about 2:8 to about 8:2. The first layer may have a thickness of about 10 Å to about 300 Å.

The metal selected from the group consisting of Yb, Ca, Sm, Eu, Tb, Sr, Ba, La, and Ce in the second layer may be from about 1% to about 50% based on the total weight of the second layer.

The second layer may have a thickness of about 100 Å to about 1000 Å.

The cathode may include: a first layer in which are co-deposited the LiF and the metal selected from the group consisting of Yb, Ca, Sm, Eu, Tb, Sr, Ba, La, and Ce; and a second layer in which are co-deposited Ag and the metal selected from the group consisting of Yb, Ca, Sm, Eu, Tb, Sr, Ba, La, and Ce.

The cathode may include: a first layer in which are co-deposited the LiF and the metal selected from the group consisting of Yb, Ca, Sm, Eu, Tb, Sr, Ba, La, and Ce; and a second layer in which are co-deposited Ag and the metal selected from the group consisting of Yb, Ca, Sm, Eu, Tb, Sr, Ba, La, and Ce, wherein the first layer may have a thickness of about 15 Å to about 50 Å, and the second layer may have a thickness of about 150 Å to about 230 Å.

The cathode may include: a first layer in which are co-deposited the LiF or Liq, and Yb; and a second layer in which are co-deposited Ag or Al, and Yb, wherein the first layer may have a thickness of about 15 Å to about 50 Å, and the second layer may have a thickness of about 150 Å to about 230 Å.

The cathode may include: a first layer in which are co-deposited the LiF and the metal selected from the group consisting of Yb, Ca, Sm, Eu, Tb, Sr, Ba, La, and Ce; and a second layer in which are co-deposited Ag and the metal selected from the group consisting of Yb, Ca, Sm, Eu, Tb, Sr, Ba, La, and Ce, wherein a composition ratio of the LiF to the metal selected from the group consisting of Yb, Ca, Sm, Eu, Tb, Sr, Ba, La, and Ce in the first layer may be from about 3:7 to about 7:3, and the metal selected from the group consisting of Yb, Ca, Sm, Eu, Tb, Sr, Ba, La, and Ce in the second layer may be from about 5% to about 15% based on the total weight of the second layer.

The cathode may include: a first layer in which are co-deposited the LiF or Liq, and Yb; and a second layer in which are co-deposited Ag or Al, and Yb, wherein a composition ratio of LiF or Liq to Yb in the first layer may be from about 3:7 to about 7:3, and Yb in the second layer may be from about 5% to about 15% based on the total weight of the second layer.

The cathode may include: a first layer in which are co-deposited the LiF and Yb; and a second layer in which are co-deposited Ag and Yb, wherein a composition ratio of LiF to Yb in the first layer may be from about 3:7 to about 7:3, and Yb in the second layer may be from about 5% to about 15% based on the total weight of the second layer.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION OF CERTAIN INVENTIVE EMBODIMENTS

The present embodiments will now be described more fully with reference to the accompanying drawings, in which example embodiments are shown.

According to an embodiment, an organic light-emitting device includes an anode, a cathode, and an emission layer (EML) between the anode and the cathode, wherein the cathode includes a first layer in which are co-deposited LiF or Liq and a metal selected from the group consisting of ytterbium (Yb), calcium (Ca), samarium (Sm), europium (Eu), terbium (Tb), strontium (Sr), barium (Ba), lanthanum (La), and cerium (Ce); and a second layer in which are co-deposited a metal selected from among silver (Ag) and aluminum (Al), and a metal selected from the group consisting of Yb, Ca, Sm, Eu, Tb, Sr, Ba, La, and Ce.

Figure 1:
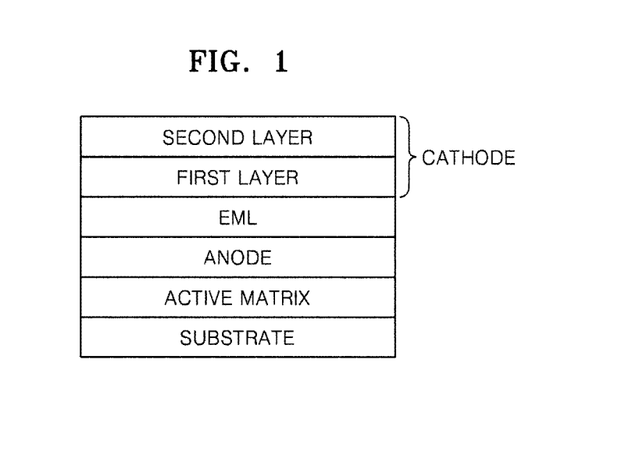
FIG. 1 schematically illustrates the structure of an organic light-emitting device according to an embodiment.

FIG. 1 schematically illustrates the structure of an organic light-emitting device according to an embodiment.

Referring to FIG. 1, the organic light-emitting device, according to an embodiment, includes a cathode having a double-layer structure including first and second layers.

The first layer or the second layer of the cathode may include a metal selected from the group consisting of Yb, Ca, Sr, Ba, La, and Ce, which are metals with low work functions that facilitate electron injection and transport from an organic layer including an EML.

In particular, when a metal selected from the group consisting of Yb, Ca, Sm, Eu, Tb, Sr, Ba, La, and Ce is used together with LiF or Liq to form the first layer, which is adjacent to the organic layer including the EML, the first layer may facilitate electron injection from the organic layer.

When a metal selected from the group consisting of Yb, Ca, Sm, Eu, Tb, Sr, Ba, La, and Ce is used together with a metal selected between Ag and Al to form the second layer, which is adjacent to the first layer, the second layer may have low light absorption characteristics, and thus may improve efficiency of the organic light-emitting device.

Ag and Al have low refractive indices and low absorbance in the visible region, and thus have good reflection characteristics.

Hereinafter, the compositions and thicknesses of the first and second layers will now be described in detail.

In some embodiments a composition ratio of LiF or Liq to a metal selected from the group consisting of Yb, Ca, Sm, Eu, Tb, Sr, Ba, La, and Ce in the first layer may be from about 2:8 to about 8:2, and in some other embodiments, may be from about 3:7 to about 7:3.

In some embodiments the first layer may have a thickness of about 10 Å to about 300 Å, and in some other embodiments, may have a thickness of about 15 Å to about 50 Å.

In some embodiments the metal selected from the group consisting of Yb, Ca, Sm, Eu, Tb, Sr, Ba, La, and Ce in the second layer may be from about 1% to about 50% based on the total weight of the second layer, and in some other embodiments, may be from about 5% to about 15%.

In some embodiments the second layer may have a thickness of about 100 Å to about 1000 Å, and in some other embodiments, may have a thickness of about 150 Å to about 230 Å.

When the composition ratios and thicknesses of the first and second layers are within these ranges, the organic light-emitting device may have optimal efficiency.

In some embodiments the cathode may include a first layer in which are co-deposited LiF and Yb, and a second layer in which are co-deposited Ag and Yb, wherein a composition ratio of LiF to Yb in the first layer may be from about 3:7 to about 7:3, and Yb in the second layer may be from 5% to about 15% based on the total weight of the second layer.

Hereinafter, a method of manufacturing an organic light-emitting device having a stack structure as described above will be described.

First, a first electrode is formed on a substrate by using a deposition or sputtering method. The first electrode may comprise a first electrode material having a high work function.

The first electrode may constitute an anode. The substrate may be a substrate conventionally used in organic light-emitting devices, and may include, for example, a glass substrate or a transparent plastic substrate with excellent mechanical strength, thermal stability, transparency, surface smoothness, ease of handling, and water resistance. Examples of the first electrode material include materials, such as indium tin oxide (ITO), indium zinc oxide (IZO), tin oxide ($SnO_2$), zinc oxide (ZnO), aluminum (Al), silver (Ag), and magnesium (Mg), which have excellent conductivity. The first electrode may be formed as a transparent or reflective electrode.

Next, a hole injection layer (HIL) may be formed on the first electrode by using various methods, for example, vacuum deposition, spin coating, casting, Langmuir-Blodgett (LB) deposition, or the like.

When the HIL is formed using vacuum deposition, the deposition conditions may vary according to the material used to form the HIL, and the structure and thermal characteristics of the HIL. For example, the deposition conditions may include a deposition temperature of about 100 to about 500° C., a vacuum pressure of about $10^{-8}$ to about $10^{-3}$ torr, and a deposition rate of about 0.01 to about 100 Å/sec.

When the HIL is formed using spin coating, coating conditions may vary according to the material used to form the HIL, and the structure and thermal properties of the HIL. For example, the coating conditions may include a coating speed of about 2000 rpm to about 5000 rpm, and a thermal treatment temperature of about 80° C. to about 200° C. at which the solvent remaining after coating may be removed.

The HIL may comprise any material that is commonly used to form a HIL. Examples of the material that can be used to form the HIL include a phthalocyanine compound such as copperphthalocyanine, 4,4',4"-tris (3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate) (PANI/PSS), but are not limited thereto.

m-MTDATA

TDATA

2T-NATA

The HIL may have a thickness of about 100 Å to about 10000 Å, and in some embodiments, may have a thickness of about 100 Å to about 1000 Å. When the thickness of the HIL is within these ranges, the HIL may have good hole injection characteristics without an increase in driving voltage.

Next, a hole transport layer (HTL) may be formed on the HIL by using various methods, for example, vacuum deposition, spin coating, casting, LB deposition, or the like. When the HTL is formed using vacuum deposition or spin coating, the deposition or coating conditions may be similar to those used to form the HIL, though the deposition or coating conditions may vary according to the material that is used to form the HTL.

Known HTL materials may be used. Examples of such HTL materials include, but are not limited to, carbazole derivatives such as N-phenylcarbazole or polyvinylcarbazole, and amine derivatives having an aromatic condensed ring, such as NPB, N,N'-bis(3-methylphenyl)-N,N'-diphenyl [1,1-biphenyl]-4,4'-diamine (TPD), or the like.

TPD

NPB

The HTL may have a thickness of about 50 Å to about 1000 Å, and in some embodiments, may have a thickness of about 100 Å to about 600 Å. When the thickness of the HTL is within these ranges, the HTL may have good hole transport characteristics without a substantial increase in driving voltage.

Next, the EML may be formed on the HTL by using various methods, for example, vacuum deposition, spin coating, casting, LB deposition, or the like. When the EML is formed using vacuum deposition or spin coating, the deposition or coating conditions may be similar to those used to form the HIL, though the deposition or coating conditions may vary according to the material that is used to form the EML.

The EML may be formed using any known light-emitting material, such as known hosts and dopants. Dopants that may be used to form the EML may include a fluorescent dopant or a phosphorescent dopant which are widely known in the art.

Examples of the host include Alq3, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, and distyrylarylene (DSA), but are not limited thereto.

TPBI

-continued

TBADN

PVK

Examples of red dopants include, but are not limited to, platinum(II) octaethylporphyrin (PtOEP), Ir(piq)$_3$, Btp$_2$Ir(acac), and DCJTB.

PtOEP

Ir(piq)$_3$

-continued

Btp$_2$Ir(acac)

Examples of green dopants include, but are not limited to, Ir(ppy)$_3$ (where "ppy" denotes phenylpyridine), Ir(ppy)$_2$(acac), Ir(mpyp)$_3$, and C545T.

Ir(ppy)$_3$

Ir(ppy)$_2$(acac)     Ir(mpyp)$_3$

C545T

Examples of blue dopants include, but are not limited to, F$_2$Irpic, (F$_2$ppy)$_2$Ir(tmd), Ir(dfppz)$_3$, ter-fluorene, 4,4'-bis(4-diphenylaminostyryl)biphenyl (DPAVBi), and 2,5,8,11-tetra-t-butyl pherylene (TBP).

F₂Irpic

(F₂ppy)₂Ir(tmd)

Ir(dfppz)₃

DPAVBi

TBP

The amount of the dopant may be in a range of about 0.1 to about 20 parts by weight, or about 0.5 to about 12 parts by weight, based on 100 parts by weight of the EML material (which is equivalent to the total weight of the host and the dopant). When the amount of the dopant is within these ranges, concentration quenching may be substantially prevented.

The EML may have a thickness of about 100 Å to about 1,000 Å, and in some embodiments, may have a thickness of about 200 Å to about 600 Å. When the thickness of the EML is within these ranges, the EML may have good light-emitting characteristics without a substantial increase in driving voltage.

When the EML includes a phosphorescent dopant, a hole blocking layer (HBL) may be formed on the EML in order to prevent diffusion of triplet excitons or holes into an electron transport layer (ETL). In this case, the HBL may comprise any material commonly used to form a HBL. Examples of such HBL materials include, but are not limited to, oxadiazole derivatives, triazole derivatives, phenathroline derivatives, BAlq, and BCP.

The HBL may have a thickness of about 50 Å to about 1,000 Å, for example, about 100 Å to about 300 Å. When the thickness of the HBL is within these ranges, the HBL may have good hole blocking characteristics without a substantial increase in driving voltage.

Next, the ETL is formed on the EML (or HBL) by using various methods, for example, vacuum deposition, spin coating, casting, or the like. When the ETL is formed using vacuum deposition or spin coating, the deposition or coating conditions may be similar to those used to form the HIL, though the deposition or coating conditions may vary according to the material used to form the ETL.

The ETL may comprise any known materials used to form an ETL. Examples of known electron transporting materials include, but are not limited to, quinoline derivatives, such as tris(8-quinolinorate)aluminum (Alq3), TAZ, BAlq, or the like.

TAZ

BAlq

The ETL may have a thickness of about 100 Å to about 1,000 Å, and in other embodiments, may have a thickness of about 100 Å to about 500 Å. When the thickness of the ETL is within these ranges, the ETL may have good electron transport characteristics without a substantial increase in driving voltage.

In addition, an electron injection layer (EIL), which facilitates injection of electrons from the cathode, may be formed on the ETL.

The EIL may comprise LiF, NaCl, CsF, $Li_2O$, BaO, or the like which are known in the art. The deposition or coating conditions for forming the EIL may be similar to those applied to form the HIL, though the deposition and coating conditions may vary according to the material that is used to form the EIL.

The EIL may have a thickness of about 20 Å to about 50 Å. When the thickness of the EIL is within these ranges, the EIL may have good electron injection characteristics without a substantial increase in driving voltage.

Then, a cathode having first and second layers according to an embodiment, as described above, may be formed on the EIL.

The organic light-emitting device according to any of the embodiments described above may be included in various types of flat panel display devices, such as top-emission, bottom-emission, double-sided, passive matrix, and active matrix organic light-emitting display devices.

Hereinafter, one or more embodiments will be described in detail with reference to the following examples. These examples are not intended to limit the purpose and scope of the one or more embodiments.

EXAMPLES

Example 1

First Layer (Yb:LiF)/Second Layer (Ag:Yb)

ITO/Ag/ITO/HIL/HTL/EML/ETL/EIL/Yb:LiF(1:1, 20 Å)/Ag;Yb(5%, 190 Å)

To manufacture an anode, a corning 15 $\Omega/cm^2$ (1200 Å) ITO glass substrate was cut to a size of 50 mm×50 mm×0.7 mm and then sonicated in isopropyl alcohol and pure water each for five minutes, and then cleaned by irradiation of ultraviolet (UV) rays for 30 minutes and exposure to ozone. 4,4',4"-tris (3-methylphenylphenylamino) triphenylamine (m-MTDATA) was vacuum-deposited on the substrate to form a HIL having a thickness of about 750 Å. Next, N,N'-di (naphthalene-1-yl)-N,N'-diphenyl benzidine (α-NPD) was vacuum-deposited on the HIL to a thickness of 150 Å to form a HTL. Then, red, green, and blue EMLs were formed on the HTL to a thickness of 400 Å, 200 Å, and 200 Å, respectively. Known light-emitting materials were used in the red, green, and blue EMLs.

Then, Alq3 was vacuum deposited on the EMLs to form an ETL having a thickness of 200 Å. LiF was vacuum-deposited on the ETL to a thickness of about 20 Å.

Then, a cathode having a double-layer structure (Yb:LiF (1:1, 20 Å)/Ag:Yb(5%, 190 Å) was formed by vacuum deposition, thereby completing the manufacture of an organic light-emitting device.

The organic light-emitting device had an area specific resistance (ASR) of about 6 ohm/sq. in the cathode (Yb:LiF/Ag:Yb), and an efficiency of about 30 cd/A.

Example 2

An organic light-emitting device was manufactured in the same manner as in Example 1, except a cathode having a double-layer structure (Yb:LiF(1:1, 20 Å)/Ag:Yb(10%, 190 Å), instead of the structure (Yb:LiF(1:1, 20 Å)/Ag:Yb (5%, 190 Å), was formed by vacuum deposition.

The organic light-emitting device had an ASR of about 10 ohm/sq. in the cathode (Yb:LiF/Ag:Yb), and an efficiency of about 29 cd/A.

Example 3

An organic light-emitting device was manufactured in the same manner as in Example 1, except a cathode having a double-layer structure (Yb:LiF(1:1, 20 Å)/Ag:Yb(15%, 190 Å), instead of the structure (Yb:LiF(1:1, 20 Å)/Ag:Yb (5%, 190 Å), was formed by vacuum deposition.

The organic light-emitting device had an ASR of about 15 ohm/sq. in the cathode (Yb:LiF/Ag:Yb), and an efficiency of about 26 cd/A.

Comparative Example

An organic light-emitting device was manufactured in the same manner as in Example 1, except a cathode having a structure (Liq (15 Å)/Mg:Ag(10:1, 115 Å), instead of the structure (Yb:LiF(1:1, 20 Å)/Ag:Yb(5%, 190 Å), was formed by vacuum deposition.

The organic light-emitting device had an ASR of about 33 ohm/sq. in the cathode (Liq/Mg:Ag), and an efficiency of about 26 cd/A.

The area specific resistances and efficiencies of the organic light-emitting devices of Examples 1-3 and Comparative Example are shown in Table 1 below.

TABLE 1

| | Yb:LiF layer | | Ag:Yb layer | | | |
|---|---|---|---|---|---|---|
| | Yb:LiF ratio | Thickness (Å) | Yb (%) | Thickness (Å) | ASR (ohm/sq.) | Efficiency (cd/A) |
| Example 1 | 1:1 | 20 | 5% | 190 | 6 | 30 |
| Example 2 | 1:1 | 20 | 10% | 190 | 10 | 29 |
| Example 3 | 1:1 | 20 | 15% | 190 | 15 | 26 |
| Comparative Example | — | (Liq layer) 15 Å | Mg:Ag = 10:1 | (Mg:Ag layer) 115 Å | 33 | 26 |

Referring to Table 1, the organic light-emitting devices of Examples 1 to 3 have lower ASRs and better efficiencies, as compared to the organic light-emitting device of Comparative Example.

High-temperature Preservation Characteristic Comparison

After preservation at about 85° C. for about 240 hours, luminosities of the organic light-emitting devices of Examples 1-3 and Comparative Example were measured.

Figure 2:
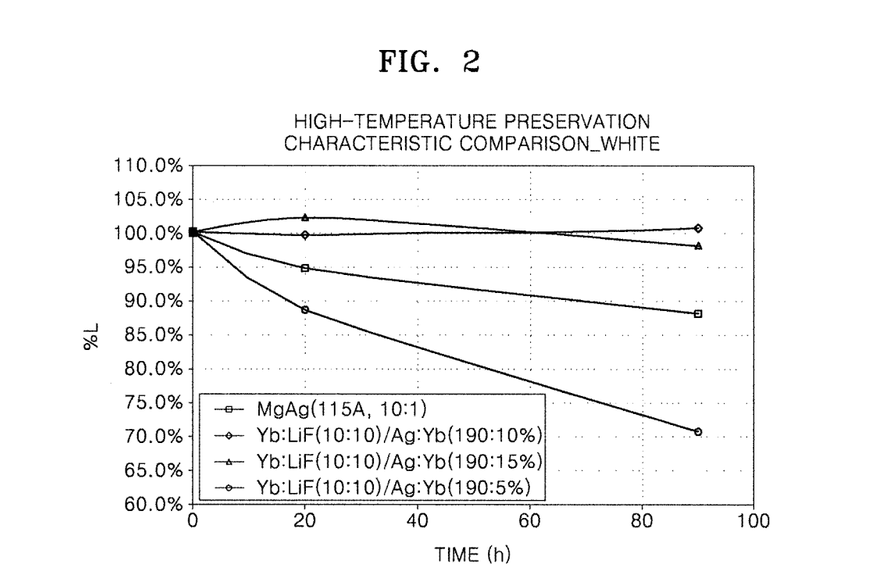
FIG. 2 is a graph comparing high-temperature preservation characteristics of organic light-emitting devices of Examples 1 to 3 and Comparative Example.

FIG. 2 is a graph comparing high-temperature preservation characteristics of the organic light-emitting devices of Examples 1 to 3 and Comparative Example.

Referring to FIG. 2, the organic light-emitting devices of Examples 2 and 3 have better high-temperature preservation characteristics, as compared to that of Comparative Example.

Ag Diffusion Comparison

Degrees of Ag diffusion after or before preservation at about 85° C. for about 240 hours were compared between a cathode having a structure (Yb:LiF (1:1, 20 Å)/Ag(10%, 190 Å), a cathode having a structure (Yb:LiF(1:1, 20 Å)/Ag:Yb(10%, 220 Å), and a cathode having a structure (Liq(15 Å)/Mg:Ag(10:1, 115 Å).

FIGS. 3A to 3D are transmission electron microscopic (TEM) images comparing the degrees of Ag diffusion in the cathodes.

Figure 3A:
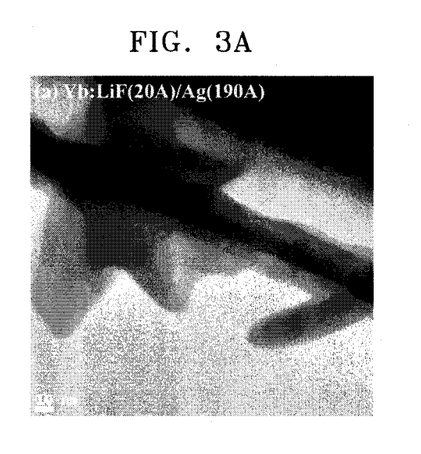
FIGS. 3A to 3D are transmission electron microscopic (TEM) images comparing the degrees of silver (Ag) diffusion in different cathodes.
Figure 3B:
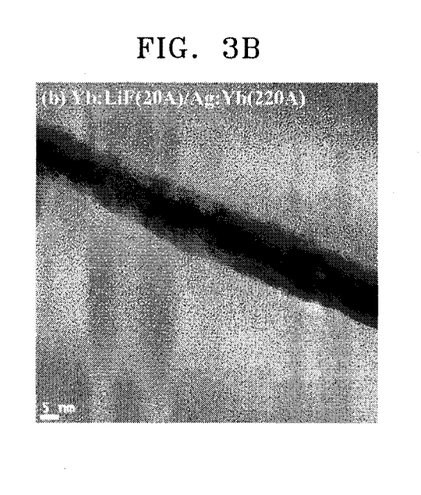

FIGS. 3A and 3B are respective TEM images of the cathode having the structure (Yb:LiF(1:1, 20 Å)/Ag(10%, 190 Å)) and the cathode having the structure (Yb:LiF (1:1, 20 Å)/Ag:Yb(10% 220 Å)), after being preserved at about 85° C. for about 240 hours. Referring to FIGS. 3A and 3B, diffusion of a larger amount of Ag is observed in the cathode in FIG. 3A, including only Ag, in which Yb was not co-deposited with Ag. However, in the cathode of FIG. 3B, in which Ag and Yb were co-deposited, only a small amount of diffusion of Ag is observed.

Figure 3C:
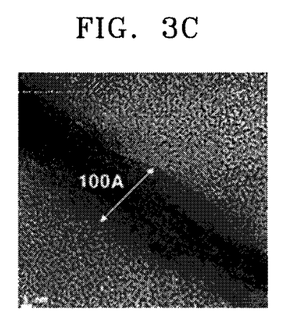
Figure 3D:
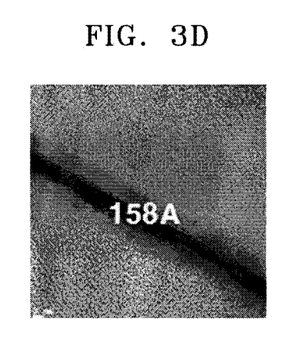

FIGS. 3C and 3D are respective TEM images of the cathode having the structure (Liq(15 Å)/Mg:Ag(10:1, 115 Å)) before and after preservation at about 85° C. for about 240 hours. Referring to FIGS. 3C and 3D, considerable diffusion of Ag is observed, both before and after the preservation, in the cathode (Liq/Mg:Ag) to which Yb was not added.

As described above, according to the one or more embodiments, an active matrix organic light-emitting device (AMOLED) may have more reliable high-temperature preservation characteristics and better efficiency, as compared to organic light-emitting devices including an MgAg cathode.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An organic light-emitting device comprising:
   an anode;
   a cathode; and
   an emission layer between the anode and the cathode,
   wherein the cathode comprises:
     a first layer in which are co-deposited LiF or Liq and a metal selected from the group consisting of ytterbium (Yb), calcium (Ca), samarium (Sm), europium (Eu), terbium (Tb), strontium (Sr), barium (Ba), lanthanum (La), and cerium (Ce); and
     a second layer in which are co-deposited silver (Ag) or aluminum (Al), and a metal selected from the group consisting of Yb, Ca, Sm, Eu, Tb, Sr, Ba, La, and Ce;
     wherein the composition ratio of the LiF or Liq to the metal selected from the group consisting of Yb, Ca, Sm, Eu, Tb, Sr, Ba, La, and Ce in the first layer is from about 2:8 to about 8:2.

2. The organic light-emitting device of claim 1, wherein the first layer has a thickness of about 10Å to about 300Å.

3. The organic light-emitting device of claim 1, wherein the metal selected from the group consisting of Yb, Ca, Sm, Eu, Tb, Sr, Ba, La, and Ce in the second layer is from about 1% to about 50% based on the total weight of the second layer.

4. The organic light-emitting device of claim 1, wherein the second layer has a thickness of about 100Å to about 1000Å.

5. The organic light-emitting device of claim 1, wherein the cathode comprises:
   a first layer in which are co-deposited the LiF and the metal selected from the group consisting of Yb, Ca, Sm, Eu, Tb, Sr, Ba, La, and Ce; and
   a second layer in which are co-deposited Ag and the metal selected from the group consisting of Yb, Ca, Sm, Eu, Tb, Sr, Ba, La, and Ce.

6. The organic light-emitting device of claim 1, wherein the cathode comprises:
   a first layer in which are co-deposited the LiF and the metal selected from the group consisting of Yb, Ca, Sm, Eu, Tb, Sr, Ba, La, and Ce; and
   a second layer in which are co-deposited Ag and the metal selected from the group consisting of Yb, Ca, Sm, Eu, Tb, Sr, Ba, La, and Ce,
   wherein the first layer has a thickness of about 15 Å to about 50 Å, and the second layer has a thickness of about 150 Å to about 230 Å.

7. The organic light-emitting device of claim 1, wherein the cathode comprises:
   a first layer in which are co-deposited the LiF or Liq, and Yb; and
   a second layer in which are co-deposited Ag or Al, and Yb,
   wherein the first layer has a thickness of about 15 Å to about 50 Å, and the second layer has a thickness of about 150 Å to about 230 Å.

8. The organic light-emitting device of claim 1, wherein the cathode comprises:
   a first layer in which are co-deposited the LiF and the metal selected from the group consisting of Yb, Ca, Sm, Eu, Tb, Sr, Ba, La, and Ce; and
   a second layer in which are co-deposited Ag and the metal selected from the group consisting of Yb, Ca, Sm, Eu, Tb, Sr, Ba, La, and Ce,
   wherein the composition ratio of the LiF to the metal selected from the group consisting of Yb, Ca, Sm, Eu, Tb, Sr, Ba, La, and Ce in the first layer is from about 3:7 to about 7:3, and
   the metal selected from the group consisting of Yb, Ca, Sm, Eu, Tb, Sr, Ba, La, and Ce in the second layer is from about 5% to about 15% based on the total weight of the second layer.

9. The organic light-emitting device of claim 1, wherein the cathode comprises:
   a first layer in which are co-deposited the LiF or Liq, and Yb; and
   a second layer in which are co-deposited Ag or Al, and Yb,
   wherein the composition ratio of LiF or Liq to Yb in the first layer is from about 3:7 to about 7:3, and
   Yb in the second layer is from about 5% to about 15% based on the total weight of the second layer.

10. The organic light-emitting device of claim 1, wherein the cathode comprises:
    a first layer in which are co-deposited the LiF and Yb; and
    a second layer in which are co-deposited Ag and Yb,
    wherein the composition ratio of LiF to Yb in the first layer is from about 3:7 to about 7:3, and
    wherein Yb in the second layer is from about 5% to about 15% based on the total weight of the second layer.

11. A cathode for an organic light-emitting device, wherein the cathode comprises:
    a first layer in which are co-deposited LiF or Liq and a metal selected from the group consisting of ytterbium (Yb), calcium (Ca), samarium (Sm), europium (Eu), terbium (Tb), strontium (Sr), barium (Ba), lanthanum (La), and cerium (Ce); and
    a second layer in which are co-deposited silver (Ag) or aluminum (Al), and a metal selected from the group consisting of Yb, Ca, Sm, Eu, Tb, Sr, Ba, La, and Ce;
    wherein the composition ratio of the LiF or Liq to the metal selected from the group consisting of Yb, Ca, Sm, Eu, Tb, Sr, Ba, La, and Ce in the first layer is from about 2:8 to about 8:2.

12. The cathode of claim 11, wherein the first layer has a thickness of about 10 Å to about 300 Å.

13. The cathode of claim 11, wherein the metal selected from the group consisting of Yb, Ca, Sm, Eu, Tb, Sr, Ba, La, and Ce in the second layer is from about 1% to about 50% based on the total weight of the second layer.

14. The cathode of claim 11, wherein the second layer has a thickness of about 100 Å to about 1000 Å.

15. The cathode of claim 11, wherein the cathode comprises:
    a first layer in which are co-deposited the LiF and the metal selected from the group consisting of Yb, Ca, Sm, Eu, Tb, Sr, Ba, La, and Ce; and
    a second layer in which are co-deposited Ag and the metal selected from the group consisting of Yb, Ca, Sm, Eu, Tb, Sr, Ba, La, and Ce.

16. The cathode of claim 11, wherein the cathode comprises:
    a first layer in which are co-deposited the LiF and the metal selected from the group consisting of Yb, Ca, Sm, Eu, Tb, Sr, Ba, La, and Ce; and
    a second layer in which are co-deposited Ag and the metal selected from the group consisting of Yb, Ca, Sm, Eu, Tb, Sr, Ba, La, and Ce,
    wherein the first layer has a thickness of about 15 Å to about 50 Å, and the second layer has a thickness of about 150 Å to about 230 Å.

17. The cathode of claim 11, wherein the cathode comprises:
    a first layer in which are co-deposited the LiF or Liq, and Yb; and
    a second layer in which are co-deposited Ag or Al, and Yb,
    wherein the first layer has a thickness of about 15 Å to about 50 Å, and the second layer has a thickness of about 150 Å to about 230 Å.

18. The cathode of claim 11, wherein the cathode comprises:
    a first layer in which are co-deposited the LiF and the metal selected from the group consisting of Yb, Ca, Sm, Eu, Tb, Sr, Ba, La, and Ce; and
    a second layer in which are co-deposited Ag and the metal selected from the group consisting of Yb, Ca, Sm, Eu, Tb, Sr, Ba, La, and Ce,
    wherein the composition ratio of the LiF to the metal selected from the group consisting of Yb, Ca, Sm, Eu, Tb, Sr, Ba, La, and Ce in the first layer is from about 3:7 to about 7:3, and
    the metal selected from the group consisting of Yb, Ca, Sm, Eu, Tb, Sr, Ba, La, and Ce in the second layer is from about 5% to about 15% based on the total weight of the second layer.

* * * * *